United States Patent [19]

[11] 3,904,879

Amingual et al.

[45] Sept. 9, 1975

[54] PHOTOVOLTAIC INFRA-RED DETECTOR

[75] Inventors: Daniel Amingual, Nogent-sur-Marne; Thuoc Nguyen Duy, Ivry-sur-Seine; Yves Riant, Maisons-Alfort, all of France

[73] Assignee: Societe Anonyme de Telecommunications, Paris, France

[22] Filed: Apr. 8, 1974

[21] Appl. No.: 458,539

[30] Foreign Application Priority Data

Apr. 12, 1973 France .............................. 73.13218

[52] U.S. Cl. .................................. 250/338; 250/370

[51] Int. Cl.[2] ........................................... G01J 1/00

[58] Field of Search ........... 250/338, 340, 370, 371, 250/330, 332

[56] References Cited

UNITED STATES PATENTS

| | | | |
|---|---|---|---|
| 3,351,758 | 11/1967 | Armantrout et al. | 250/370 |
| 3,466,448 | 9/1969 | De Vaux | 250/338 |
| 3,808,435 | 4/1974 | Bate et al. | 250/332 |

*Primary Examiner*—Archie R. Borchelt
*Attorney, Agent, or Firm*—Marmaduke A. Hobbs

[57] ABSTRACT

An elementary detector of infra-red radiation having a wavelength of 9–15 $\mu$, comprising a semiconductor material having an n-type region and a p-type region separated by a junction plane, the sensitive surface of the detector being perpendicular to said junction plane, wherein the inverse impedance of the detector is high due to the fact that the area of said sensitive surface exceeds the area of said junction plane.

6 Claims, 6 Drawing Figures

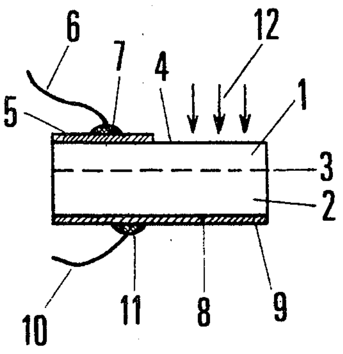
fig. 1
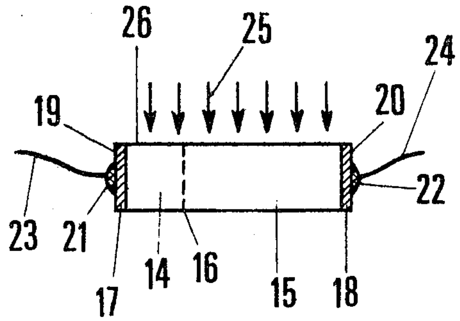
fig. 2
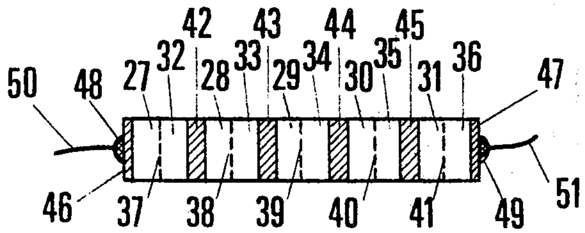
fig. 3-a
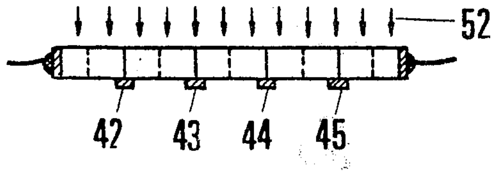
fig. 3-b
fig. 4-a
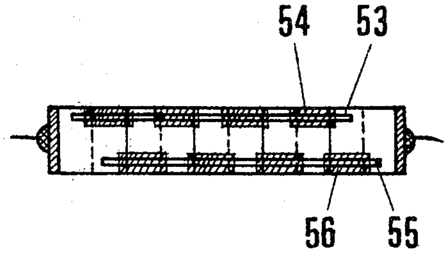
fig. 4-b
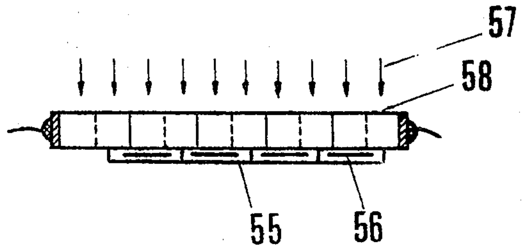

PHOTOVOLTAIC INFRA-RED DETECTOR

The present invention relates to photovoltaic infra-red detectors employing Hg Cd Te crystals.

Such known detectors comprise essentially a semiconductor block having two regions of different type: a *p*-type region and an *n*-type region. Each of these regions carries an output electrode or connection. The presence of an infra-red radiation which impinges upon either of the *n*or *p*-faces produces between the two electrodes a voltage difference which depends on the intensity of the infra-red radiation and the detectivity of the Hd Cd Te photovoltaic detector.

In particular, French Pat. No. 1,504,497 describes "a process for the treatment of semiconductor alloys of cadmium and mercury tellurides" which produces the material for constructing photovoltaic detectors and having for this purpose a given charge carrier concentration and a *p-n* type semiconductor junction.

Presently-known detectors constructed with this material are such that their sensitive surface is parallel to the plane of the semiconductor junction. In such detectors, the infra-red radiation to be detected, perpendicular to the plane of the junction, impinges upon the *n* face parallel to the junction. On principle, this sensitive face has a surface which is identical to the junction surface, but in practice, the effective sensitive surface is reduced by the presence on the sensitive face of a metallized region serving to secure one of the output connections of the detector. Consequently, the surface of the junction exceeds the sensitive surface; more particularly, in presently-known detectors the surface of the junction is twice as large as the sensitive surface.

For the diode that said detector in fact constitutes, the fact of having a large junction surface results in a high saturation current and a low resistance of the diode at zero voltage; this resistance is inversely proportional to the surface of the junction.

The low value of the impedance of known detectors renders their electronic adaptation difficult when they must operate with a long wavelength or at a relatively high temperature with respect to the temperature of the liquid nitrogen, these two conditions further reducing the impedance.

In order to overcome this drawback, an object of the present invention is to provide photovoltaic infra-red detector of infra-red radiation of 9–15 $\mu$ wavelength constituted by a semiconductor material comprising an *n*-type region and a *p*-type region separated by a junction plane, the sensitive surface of the detector being perpendicular to said junction plane, wherein the inverse impedance of the detector is high due to the fact that the area of said sensitive surface exceeds the area of said junction plane.

The novel arrangement of the detector according to the invention has for main advantage to permit an increase in the sensitive surface and the reduce the surface of the junction, as desired and independently of each other, so as to achieve optimum characteristics of the detector according to the invention.

The detector according to the invention has an impedance which is about 10 times higher than detectors known at the present time, it being understood that the detectors thus compared are employed at the same temperature, have an identical sensitive surface and are constructed from the same semiconductor material.

Further, as compared with known detectors, the detector according to the invention has a higher detectivity in addition to a more uniform response so that it may be employed with longer wavelengths for example wavelengths exceeding 13 microns.

The features and advantages of the detector according to the invention will be more appearant from the ensuing description with reference to the accompanying drawings.

In the drawings:

FIG. 1 is a view recalling the structure of a known detector;

FIG. 2 is a view of the structure of the detector according to the invention;

FIGS. *3a* and *3b* are two view of one example of the utilisation of detectors according to the invention associated in a series circuit, and FIGS. *4a* and *4b* are two views of an example of utilisation of detectors according to the invention associated in a parallel circuit.

The semiconductor Hg Cd Te material block comprises, in a known structure, an *N*type region 1 separated from a *p*-type region 2 by a junction 3. The sensitive surface of the detector thus formed is the face 4 which is of *n*-type and is parallel to the junction 3. This face has a non-sensitive part covered with a metallization 5 serving to secure a connecting wire 6 by a solder 7. The face 8 opposed to the face 4 is also parallel to the junction 3; it is of *p*-type and may be entirely covered with a metallization 9 for securing a connecting wire 7 by a solder 11. The radiation to be detected, represented in FIG. 1 by the arrows 12, is perpendicular to the sensitive face 4 and therefore to the junction plane 3.

FIG. 2 shows the novel structure of a detector according to the invention. An *n*-type region 14 is separated from a p-type region 15 by a junction 16. The two operative faces of the detector 17 and 18 parallel to the junction 16 are entirely covered with metallizations 19 and 20 to which are secured by solders 21 and 22 connecting wires 23 and 24. The radiation to be detected, represented in FIG. 2 by arrows 25, is perpendicular to the sensitive face of the detector and therefore parallel to the plane of the junction 16.

Note that, in the detector according to the invention, the sensitive face is not homogeneous and comprises an *n*-type region and a *p*-type region.

The following table summarizes the features and performances of a known detector and a detector according to the invention constructed with the same semiconductor material.

| | | Known detector | Detector according to the invention |
|---|---|---|---|
| Size of the sensitive face in sq. mm | | $1.28 \times 10^{-2}$ | $0.64 \times 10^{-2}$ |
| Thickness of the detector in mm | | 0.25 | 0.05 |
| Effective sensitive surface in sq. mm | | $0.64 \times 10^{-2}$ | $0.64 \times 10^{-2}$ |
| Surface of the junction in sq. mm. | | $1.28 \times 10^{-2}$ | $0.4 \times 10^{-2}$ |
| $\lambda_M$ { wavelength in respect of which the detector has maximum sensitivity | microns | 10.7 | 10.5 |
| Resistance at 77°K | K Ω | 3 | 80 |
| Resistance at 110°K | K Ω | 0.45 | 5 |

-Continued

| | Known detector | Detector according to the invention |
|---|---|---|
| Detectivity at 77°K for $\lambda_M$ cm $Hz^{1/2}W^{-1}$ | $3 \times 10^{10}$ | $10^{11}$ |
| Detectivity at 110°K for $\lambda_M$ cm $Hz^{1/2}W^{-1}$ | $9 \times 10^{9}$ | $1.8 \times 10^{10}$ |

This table shows that, in respect of detectors whose sensitive surface is identical, the overall size of the detector according to the invention is less than that of the known detector, its resistance is much higher than that of the known detector and its detectivity is 2 to 3 times higher than that of the known detector.

Moreover, the detector according to the invention has the advantage of having a more uniform sensitivity as a function of the wavelength. This is explained by the fact that, irrespective of the depth of penetration of the incident photons, the creation of the minority carriers occurs at equal distance from the junction.

The detector according to the invention lends itself particularly well to the construction of a detection assembly comprising the association, in series or in parallel, of a plurality of the detectors just described which constitute elementary detectors.

FIG. 3*a* shows by way of an example to which the invention is not intended to be limited, a detector comprising the association of five elementary detectors connected in series. There are shown in succession the *n* layers 27, 28, 29, 30 and 31 interposed with the *p* layers 32, 33, 34, 35 and 36 and constituting therewith junctions 37, 38, 39, 40 and 41. These junctions are the active element of the elementary detectors. The other junctions, separating for example the regions 32 and 28, are short-circuited on the face shown in FIG. 3*a* which is the face opposed to the sensitive face of the detector, by metallisations 42, 43, 44, 45. At the ends of the detector thus constructed, metallisation 46 and 47 enable connecting wires 50 and 51 to be connected by solders 48 and 49.

FIG. 3*b* shows the same detector as that shown in FIG. 3*a* but seen from a side or face perpendicular to that shown in FIG. 3*a*. In this figure, the radiation to be detected is represented by the arrows 52. Note that the direction of this radiation is parallel to the plane of the junctions represented by dotted lines in this figure.

FIGS. 4*a* and 4*b* show two perpendicular faces of a detector formed by the association of five elementary detectors according to the invention connected in parallel. FIG. 4*a* is a view of the face opposed to the sensitive face of the detector. Regions alternately of *n*-type and *p*-type succeed each other and the *n*-type regions are interconnected by a conductive bar 53 and, in the region of this bar, the *p*-type regions are insulated from this bar by an insulating layer or plate 54. Likewise, the *p*-type regions are interconnected by a conductive bar 55 whereas the *n*-type regions are insulated therefrom by insulating layers or plates 56. FIG. 4*b* shows the same detector which is a view of a face perpendicular to that shown in FIG. 4*a*. In this figure, the radiation to be detected, represented by arrows 57, impinges upon the sensitive face 58 which is perpendicular to the plane of the junctions of the elementary detectors whose interconnection in parallel constitutes the detector shown in FIGS. 4*a* and 4*b*.

The successive *n* and *p* layers for the manufacture of detectors such as those shown in FIGS. 3 and 4, may be obtained by different known processes and in particular by the successive deposits by epitaxy.

The detector according to the invention has many uses for the detection of infra-red radiation having a long wavelength. It has the advantage over known detectors of having a higher impedance and higher detectivity.

What we claim is:

1. A photovoltaic detector of infra-red radiation having a wavelength of 9–15 $\mu$, comprising a semiconductor material having an *n*-type region and a *p*-type region separated by a junction plane, the sensitive surface of the detector being perpendicular to said junction plane and the area of said sensitive surface exceeding the area of said junction plane, resulting in a high inverse impedance of the detector.

2. A photovoltaic detector of infra-red radiation comprising a plurality of elementary detectors according to claim 1, assembled in such manner as to constitute a superposition of an even number of alternately *n* and *p* layers, wherein every other junction is electrically short-circuited and one of the output connections of said detector is secured to the first layer and the other to the last layer of the superposition of the layers.

3. A photovoltaic detector of infra-red radiation comprising a plurality of elementary detectors according to claim 1 assembled in such manner as to form a superposition of an even number of alternately *n* and *p* layers, wherein one of the output connections is secured to the first layer and the other to the last layer of the superposition of layers and the layers of the same type are electrically interconnected.

4. A photovoltaic detector of infra-red radiation according to claim 1, wherein the semiconductor material is Hg Cd Te.

5. A photovoltaic detector of infra-red radiation according to claim 1, wherein the semiconductor material is Pb Sn Te.

6. A photovoltaic detector of infra-red radiation according to claim 1, wherein the semiconductor material is Pb Sn Se.

* * * * *